(12) United States Patent
Boorom (10) Patent No.: US 6,420,878 B1
(45) Date of Patent: Jul. 16, 2002

(54) SYSTEM AND METHOD OF INTEGRATED CIRCUIT SELF-TESTING OF CIRCUIT BOARD CONNECTORS

(75) Inventor: Kenneth F. Boorom, Boise, ID (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/438,443

(22) Filed: Nov. 12, 1999

(51) Int. Cl.[7] .............................................. G01R 31/11
(52) U.S. Cl. ........................ 324/533; 324/534; 324/527
(58) Field of Search ................................ 324/500–537, 324/763, 533, 532, 538, 534, 527, 66; 361/88

(56) References Cited

U.S. PATENT DOCUMENTS

| | | | | |
|---|---|---|---|---|
| 2,948,953 A | * | 8/1960 | Rayburn | .................. 29/155.55 |
| 5,376,889 A | * | 12/1994 | Milroy et al. | ................ 324/644 |
| 5,384,847 A | * | 1/1995 | Hendrickson et al. | ........ 380/23 |
| 5,498,972 A | * | 3/1996 | Haulin | ........................ 324/765 |
| 5,825,640 A | * | 10/1998 | Quigley et al. | ................ 363/60 |
| 6,097,202 A | * | 8/2000 | Takahashi | .................... 324/761 |

* cited by examiner

*Primary Examiner*—Safet Metjahic
*Assistant Examiner*—Paresh Patel (57) ABSTRACT

An integrated circuit self-testing system that includes an integrated circuit connected to a circuit board. The integrated circuit includes an output. A connector is attached to the circuit board. A conductive trace of the circuit board electrically connects the output of the integrated circuit to the connector. The conductive trace includes a first section extending between the output of the integrated circuit and the connector of the circuit board, and a second section extending beyond the connector. The integrated circuit includes a pulse generator, that generates a pulsed voltage potential at the output. The integrated circuit further includes a pulse transient detector that detects transients in the voltage potential of the output due to a reflected pulse voltage potential received at the output, thereby indicating whether the connector is properly connected to the conductive trace.

14 Claims, 7 Drawing Sheets

SYSTEM AND METHOD OF INTEGRATED CIRCUIT SELF-TESTING OF CIRCUIT BOARD CONNECTORS

FIELD OF INVENTION

This invention relates generally to testing of circuit board connectors. In particular, it relates to self-testing of connectors that are electrically connected to outputs an integrated circuit located on the circuit board.

BACKGROUND

Integrated circuits typically include a large amount of electronic circuitry. The electronic circuitry generally includes an even larger number of electrical interconnections. The interconnections can fail, causing the electronic circuitry to operate improperly. Therefore, the electronic circuitry including the interconnections must be tested to ensure that the electronic circuitry is operable and is properly connected.

Many integrated circuits include built-in self-testing. Built-in self-testing of the circuitry of integrated circuits generally includes the integrated circuits internally testing electronic connections within the integrated circuit without the requirement of external test equipment. As a result, built-in self-testing reduces the cost of manufacturing integrated circuits because built-in self-testing eliminates the purchase, programming and design of external test equipment.

Integrated circuits are typically interconnected to circuit boards which are in turn connected to other circuit boards. Outputs and inputs of the integrated circuits are connected to conductive traces on the circuit boards. The conductive traces are electrically connected to connectors that provide a conductive interconnection to the other circuit boards.

Built-in self-testing can test the integrity of electronic circuits located within an integrated circuit, but cannot test the integrity of interconnections between the integrated circuits and the connectors of the circuit boards without the presence of additional external test fixtures. Therefore, the connectors must be tested separately, requiring separate test equipment. In addition, time for testing the connectors must be allocated during manufacture of the circuit boards.

It is desirable to have a system and method for built-in self-testing of connectors of a circuit board that are electrically connected to the inputs and outputs of an integrated circuit.

SUMMARY OF THE INVENTION

The present invention is a system and method for built-in self-testing of connectors of a circuit board that is electrically connected to the inputs and outputs of an integrated circuit.

A first embodiment of this invention includes an integrated circuit self-testing system. The integrated circuit self-testing system includes a circuit board and an integrated circuit connected to the circuit board. The integrated circuit includes an output. A connector is attached to the circuit board. A conductive trace of the circuit board electrically connects the output of the integrated circuit to the connector. The conductive trace includes a first section extending between the output of the integrated circuit and the connector of the circuit board, and a second section extending beyond the connector. The integrated circuit includes a pulse generator, that generates a pulsed voltage potential at the output. The integrated circuit further includes a pulse transient detector that detects transients in the voltage potential of the output due to a reflected pulse voltage potential received at the output, thereby indicating whether the connector is properly connected to the conductive trace. It is to be understood that the invention can and is generally extended to include many connectors connected to many outputs of the integrated circuit through many conductive traces.

A second embodiment of this invention is similar to the first embodiment. The pulse generator of the second embodiment includes a digital logic gate that drives the output of the integrated circuit from a low voltage potential to a high voltage potential.

A third embodiment of this invention is similar to the second embodiment. The pulse transient detector of third embodiment includes a peak detector capacitor in which a final voltage potential of the peak detector capacitor is dependent upon the output of the integrated circuit receiving a negative transient pulse.

A fourth embodiment of this invention is similar to the third embodiment. The pulse transient detector of the fourth embodiment further includes a peak detector diode that conducts charge from the peak detector capacitor when the output of the integrated circuit receives a negative transient pulse.

A fifth embodiment of this invention is similar to the fourth embodiment, but the pulse transient detector of the fifth embodiment further includes an analog to digital converter connected to the peak detector capacitor, the analog to digital converter detecting the voltage potential of the peak detector capacitor.

Another embodiment of the invention includes a method of self-testing connectors that are connected to a circuit board. At least one of the connectors is electrically connected to an output of an integrated circuit that is attached to the circuit board through a conductive trace. The conductive trace includes a first section extending between the output of the integrated circuit and the connector of the circuit board, and a second section extending beyond the connector. The method includes generating a pulsed voltage signal at the output of the integrated circuit, and detecting transients in the voltage potential of the output due to a reflected pulse voltage potential received at the output, thereby indicating whether the connector is properly connected to the conductive trace.

Other aspects and advantages of the present invention will become apparent from the following detailed description, taken in conjunction with the accompanying drawings, illustrating by way of example the principles of the invention.

DETAILED DESCRIPTION

As shown in the drawings for purposes of illustration, the invention is embodied in a system and method for built-in self-testing of connectors of a circuit board that are electrically connected to the inputs and outputs of an integrated circuit.

Figure 1:
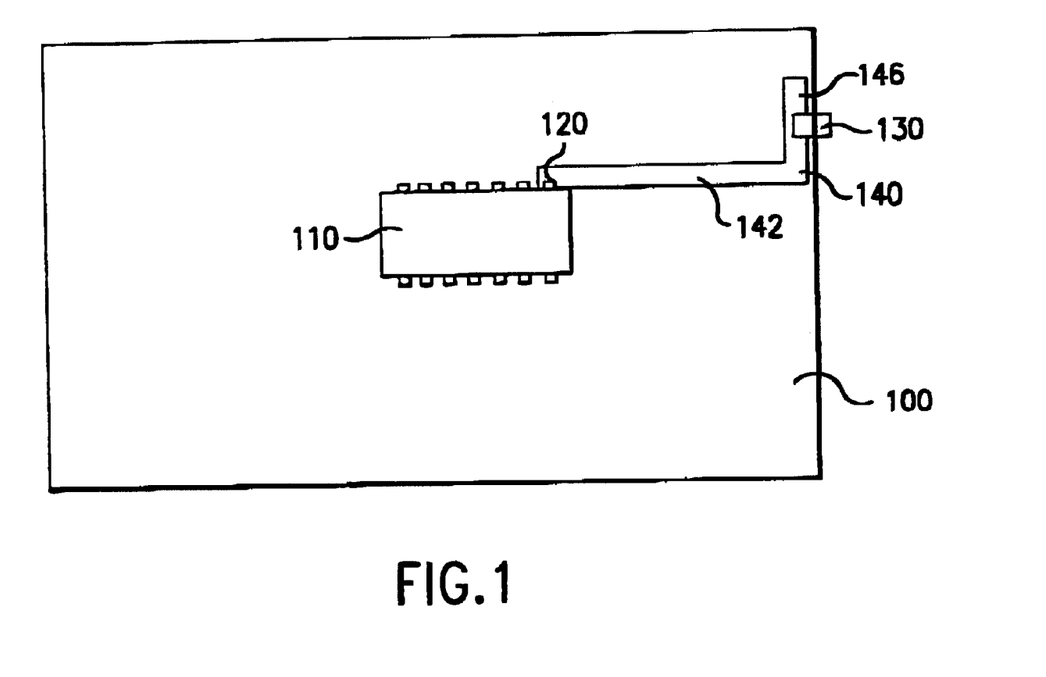
FIG. 1 shows an integrated circuit connected to a circuit board that includes a conductive trace and a connector.

FIG. 1 shows a first embodiment of the invention. This embodiment includes an integrated circuit self-testing system. The integrated circuit self-testing system includes a circuit board 100 and an integrated circuit 110 connected to the circuit board 100. The integrated circuit 110 includes an output 120. A connector 130 is attached to the circuit board 100. A conductive trace 140 of the circuit board 100 electrically connects the output 120 of the integrated circuit 110 to the connector 130. The conductive trace 140 includes a first section 142 extending between the output 120 of the integrated circuit 110 and the connector 130 of the circuit board 100, and a second section 146 extending beyond the connector 130. The integrated circuit 110 includes a pulse generator, that generates a pulsed voltage potential at the output. The integrated circuit 110 further includes a pulse transient detector that detects transients in the voltage potential of the output 120 due to a reflected pulse voltage potential received at the output 120, thereby indicating whether the connector 130 is properly connected to the conductive trace 140.

FIG. 1 only shows a single connector 130, a single conductive trace 140 and a single output 120. However, it is to be understood that the invention can and is generally extended to include many connectors connected to many outputs of the integrated circuit 110 through many conductive traces.

Testing the integrity of the electrical connection between the output 120 of the integrated circuit 110 and the connector 130 requires the pulse generator of the integrated circuit 110 to be able to generate a clean, high-slew rate step function voltage waveform. If the connector 130 is not properly connected to the conductive trace 140, the pulse generated by the pulse generator will travel down the conductive trace 140, reflect off the end of the conductive trace 140 (the end of the conductive trace 140 is an open circuit), and additively sum with the voltage potential of the output 120 of the integrated circuit 110. If the connector 130 is properly connected to the conductive trace 140, then the pulse generated by the pulse generator will again travel down the conductive trace 140, but a portion of the pulse will be negatively reflected due to the impedance of the connector 130, and subtractively sum with the voltage potential of the output 120 of the integrated circuit 110. The subtractively reflected portion of the pulse due to the impedance of the connector 130 will cause a negative transient at the output 120 of the integrated circuit 110.

The inclusion of the second section 146 of the conductive trace 140 beyond the connector 130 greatly simplifies the process of detecting the transient. Separating the end of the conductive trace 140 (through the inclusion of the second section 146) from the connector 130 in the spatial domain corresponds to a separation of the subtractively summing reflection of the connector 130, and the additively summing reflection of the end of the conductive trace 140 in the time domain.

Figure 2:
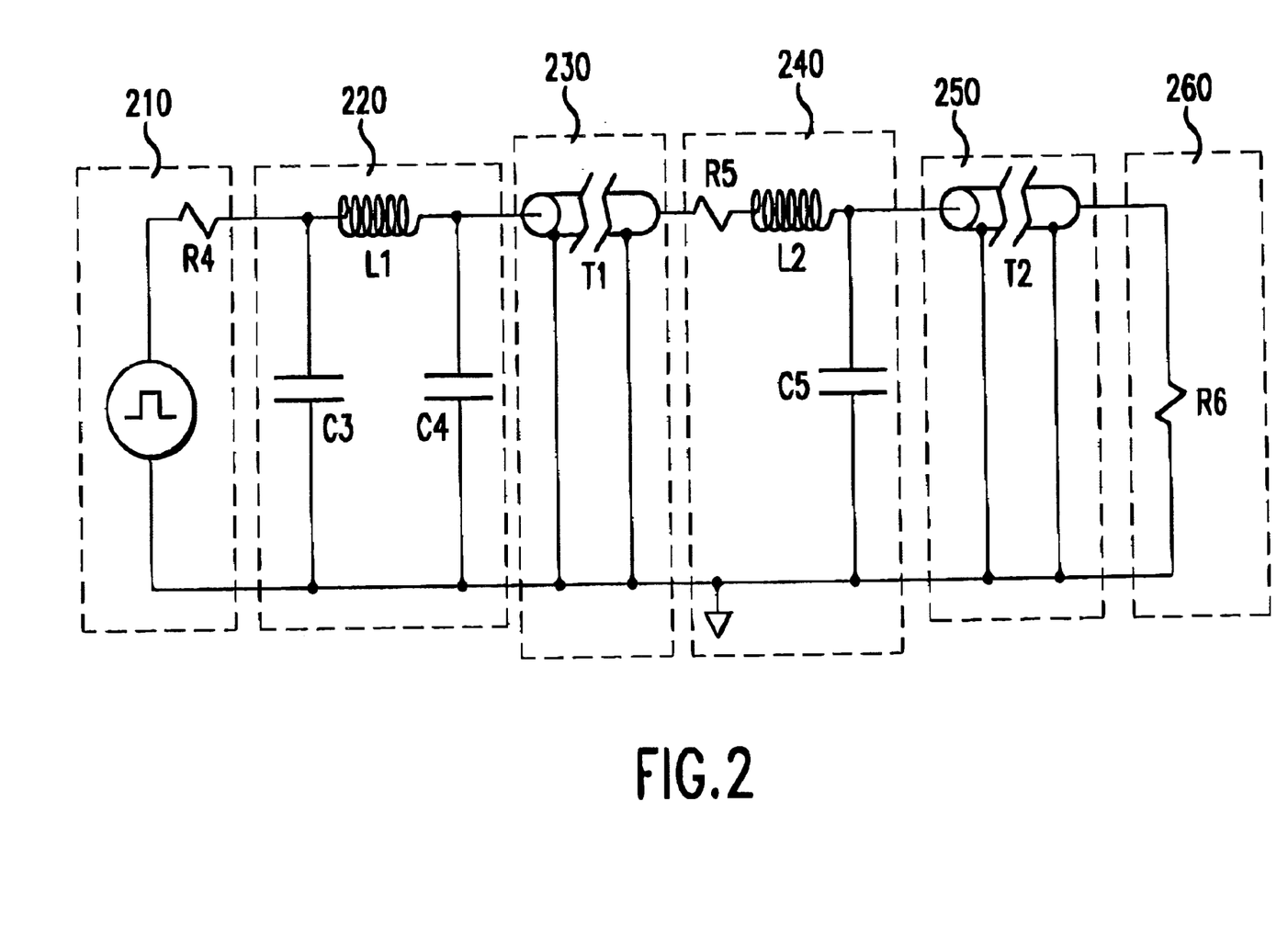
FIG. 2 is a schematic of a circuit used to simulate the pulse generator, the transient detector, the conductive trace and the connector.

FIG. 2 is a schematic of a circuit used to simulate the voltage potential waveforms of the pulse generator, the conductive trace and the connector. The circuit of FIG. 2 includes a pulse generator section 210, an output connection section 220, a first conductive trace section 230, a connector section 240, a second conductive trace section 250, and a termination section 260.

The pulse generator section 210 includes the pulse generator within the integrated circuit. A 50 ohm impedance R4 has been included for the simulation. R4 represents the output impedance of the pulse generator. The output impedance does not have to match the impedance of the circuit board, but should be a low impedance. For the purposes of simulation, the pulse generator section 210 generates a pulse having an initial voltage potential of zero volts, a final value of 3.3 volts, and a risetime of 200 pico-seconds.

The output connection section 220 includes circuit elements (L1, C3, C4) that represent the distributed circuit elements of the connection between the integrated circuit and the circuit board. The distributed elements (L1, C3, C4) vary depending upon the type of mechanical package the integrated circuit is within. For the purposes of simulation, the mechanical package is assumed to be a ball grid array (BGA). Different mechanical packaging configurations require different circuit elements for simulation. The circuit elements can be experimentally determined using Time Domain Reflectometry (TDR) and high-frequency oscilloscopes as is well known in the art of electronics.

The first conductive trace section 230 includes a transmission line T1 that represents the first section 142 of the conductive trace 140. For the simulation, the transmission line T1 is modeled as a 5 centimeter trace on an FR4 circuit board. The FR4 circuit board is modeled as having a dielectric constant of 2.4.

The connector section 240 includes circuit elements (R5, L2, C5) that represent the distributed impedances of the connector 130. The circuit elements (R5, L2, C5) are as specified in a data book of a popular type of 50 ohm connector, Generally, the manufacturers of the connectors provide the distributed circuit elements of the connectors. If the distributed circuit elements are not provided by the manufacturers, then the distributed circuit parameters must be experimentally determined.

The second conductive trace section 250 includes a transmission line T2 that represents the second section 146 of the conductive trace 140. For the simulation, the transmission line T2 is modeled as a 1.5 centimeter trace on an FR4 circuit board. The FR4 circuit board is modeled as having a dielectric constant of 2.4.

The termination section 260 includes a high impedance R6 that represents the open circuit end of the second section 146. R6 is included merely for the operation of the simulation of the circuit. For the circuit simulation described later, R6 is modeled as approximately 20 Megaohms.

Figure 3A:
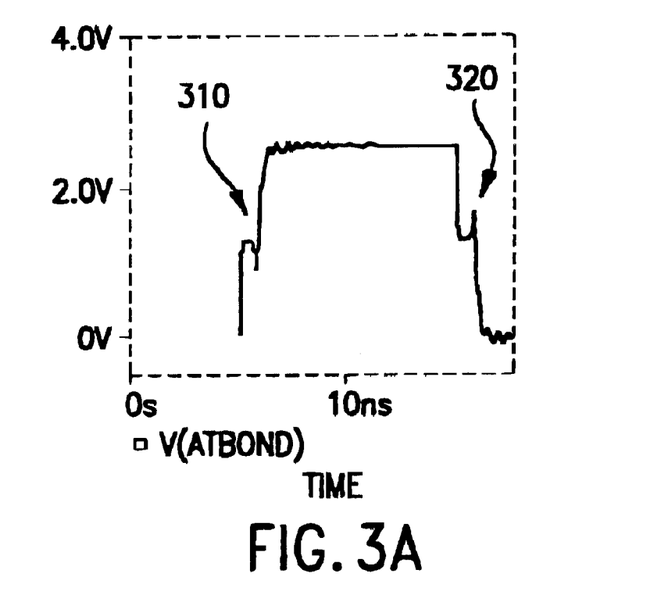
FIGS. 3A and 3B are traces that represent the voltage potential at the output of the integrated circuit when the connector is properly and improperly connected to the conductive trace.
Figure 3B:
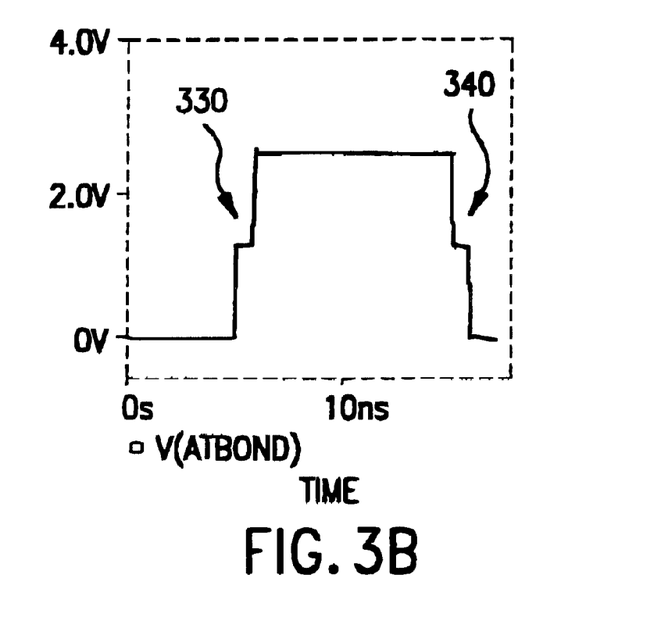

FIGS. 3A and 3B are traces that represent the voltage potential at the output of the integrated circuit 110 when the connector 130 is properly and improperly connected to the conductive trace 140. The traces of FIG. 3A and FIG. 3B are generated through simulation of the schematic shown in FIG. 2.

The trace in FIG. 3A represents the voltage potential at the output of the integrated circuit 110 when the connector 130 is properly connected to the conductive trace 140. Transients caused by reflections from the connector 130 can be observed on both the rising edge 310 and the falling edge 320 of the pulse.

The trace in FIG. 3B represents the voltage potential at the output of the integrated circuit 110 when the connector 130 is not properly connected to the conductive trace 140. Transients do not appear on either the rising edge 330 or the falling edge 340 of the pulse.

Figure 4:
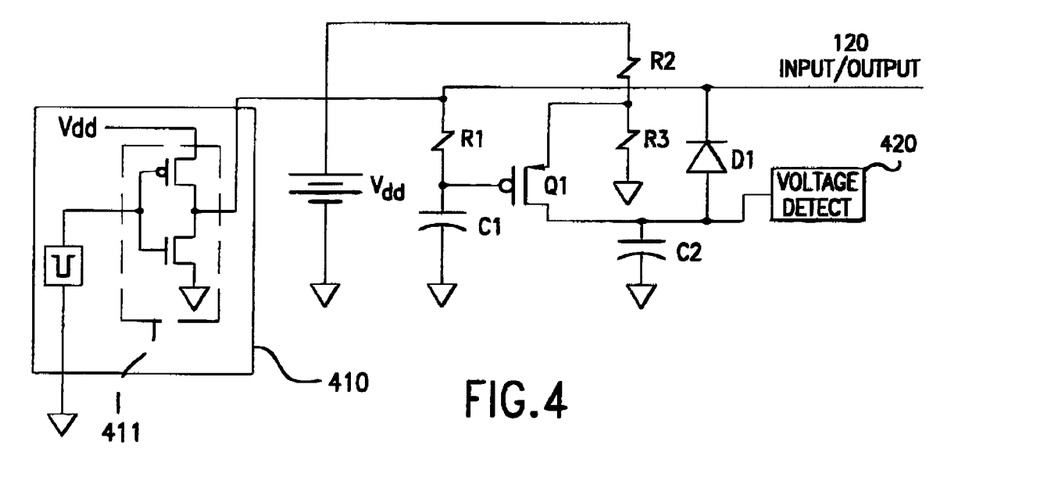
FIG. 4 is a circuit schematic of an embodiment of a pulse generator and transient detector according to the invention.

FIG. 4 is a circuit schematic of an embodiment of a pulse generator and transient detector according to the invention. The circuit includes a pulse generator 410. The pulse generator 410 can be as simple as a digital gate 411 that generates a low to high to low voltage potential. A controller within the integrated circuit can be programmed to generate or cause the generation of the requisite pulse. The output of the pulse generator 410 is directly coupled to the input/output 120 of the integrated circuit 110. Many variations and types of pulse generators are known in the art of electronic circuits which can be used to generate the required pulse. Additionally, the controllers which can be used to cause the generation of a pulse are well known in the art of electronic circuit.

The circuit schematic of FIG. 4 further includes a gate resistor R1, a gate capacitor C1, a first drain resistor R2, a second drain resistor R3, a transistor Q1, a peak detector capacitor C2, a peak detect diode D1 and a voltage detector 420. A power supply voltage Vdd determines the voltage potential of the drain of the transistor Q1 through the combination of the first drain resistor R2 and the second drain resistor R3. The transistor Q1 of FIG. 4 is a PMOS transistor.

Before the pulse generator 410 has generated a pulse, the gate capacitor C1 and the peak detector capacitor C2 are fully discharged and the transistor Q1 is conducting current. When a pulse is generated by the pulse generator 410, the voltage potential of the gate of the transistor Q1 begins to rise as the gate capacitor C1 charges up at a speed determined by the RC time constant of the gate capacitor C1 and the gate resistor R1. As the voltage potential of the gate of the transistor Q1 increases, the peak detector capacitor C2 to begin to charge. Eventually, the voltage potential of the gate of the transistor Q1 increases high enough to cause the transistor Q1 to turn off. The peak detector capacitor C2 maintains the conducted charge. However, charge is conducted off of the peak detector capacitor C2 if the voltage potential of the input/output 120 falls low enough to cause the peak detect diode D1 to conduct. Such a condition occurs when a negative transient caused by a properly connected connector is received by the input/output 120.

The combination of the peak detector capacitor C2 and the peak detect diode D1 provide for the detection of negative transients in the voltage potential at the output/input 120 of the integrated circuit 110. Negative transients at the output/input 120 cause the peak detect diode D1 to conduct and draw charge off of the peak detector capacitor C2. The result is that the final voltage due to charge held by the peak detector capacitor C2 will be lower when the peak detect diode D1 conducts and draws charge off of the peak detector capacitor C2 due to a negative transient, than when the peak detect diode D1 does not conduct due to the absence of a negative transient. Due to the fact that a negative transient will only occur if the connector 130 is properly connected to the conductive trace 140, the final voltage of the peak detector capacitor C2 can be used to detect whether the connector 130 is properly connected to the conductive trace 140. That is, if the connector 130 is properly connected to the conductive trace 140, the final voltage potential of the peak detector capacitor C2 will be lower than it would be if the connector 130 is not properly connected to the conductive trace 140.

A voltage detector 420 detects or samples the final voltage potential across the peak detector capacitor C2. Generally, the voltage detector 420 is an analog to digital converter which is well known in the art of electronic circuits. However, the voltage detector 420 can be any type of circuitry which provides information as to whether the final voltage potential across the peak detector capacitor C2 is above or below a predetermined threshold, thereby indicating whether the connector 130 is properly connected. The predetermined threshold voltage is generally determined through computer simulation.

Figure 5:
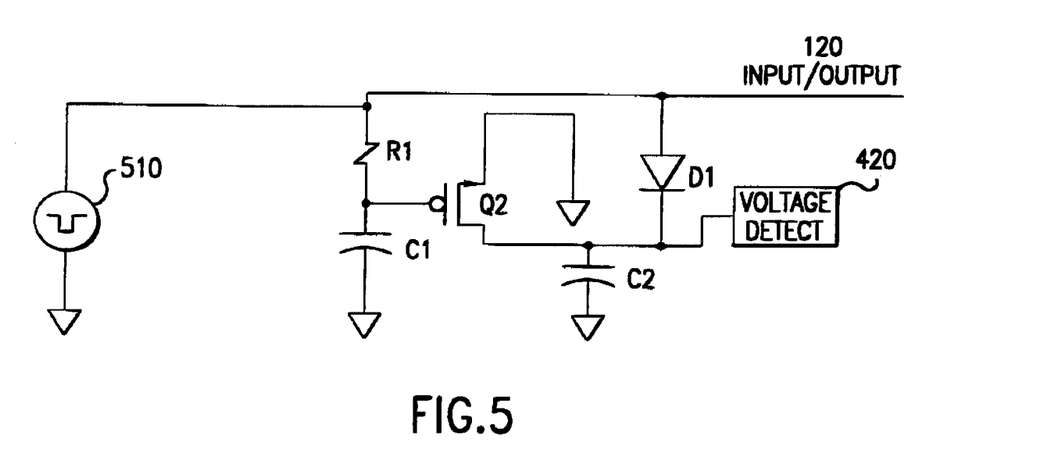
FIG. 5 is a circuit schematic of another embodiment of a pulse generator and transient detector according to the invention.

FIG. 5 is a circuit schematic of another embodiment of a pulse generator and transient detector according to the invention. This embodiment includes the pulse generator generating a negative pulse. That is a high voltage potential to low voltage potential pulse is generated by the pulse generator. The PMOS transistor Q1 is replaced with an NMOS transistor Q2. The peak detect diode D1 is reversed. That is, the anode and the cathode of the peak detect diode D1 are reversed. The operation of the circuit of FIG. 5 is analogous to the operation of the circuit of FIG. 4, but the voltages of the circuit are inverted.

For the embodiment of the invention shown in FIG. 5, the transient caused by a properly connected connecter 130 will positively add to the voltage potential at the output/input 120 causing the peak detect diode D1 to conduct charge onto the peak detector capacitor C2. Therefore, a properly connected connector 130 can be determined if the voltage detector 420 determines the final voltage potential of the peak detector capacitor C2 to be above the predetermined threshold voltage.

Figure 6A:
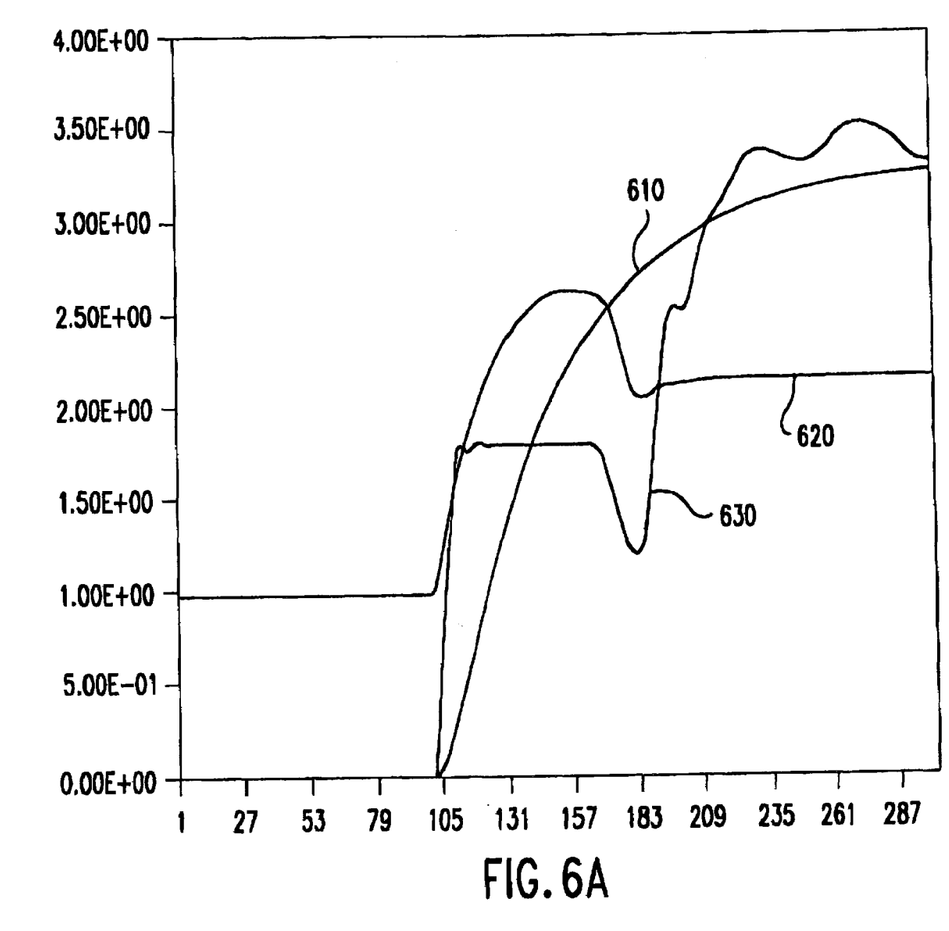
FIGS. 6A and 6B are traces the represent voltage potentials at select points within the circuit of the pulse generator and transient detector shown in FIG. 4 during the generation of a pulse.
Figure 6B:
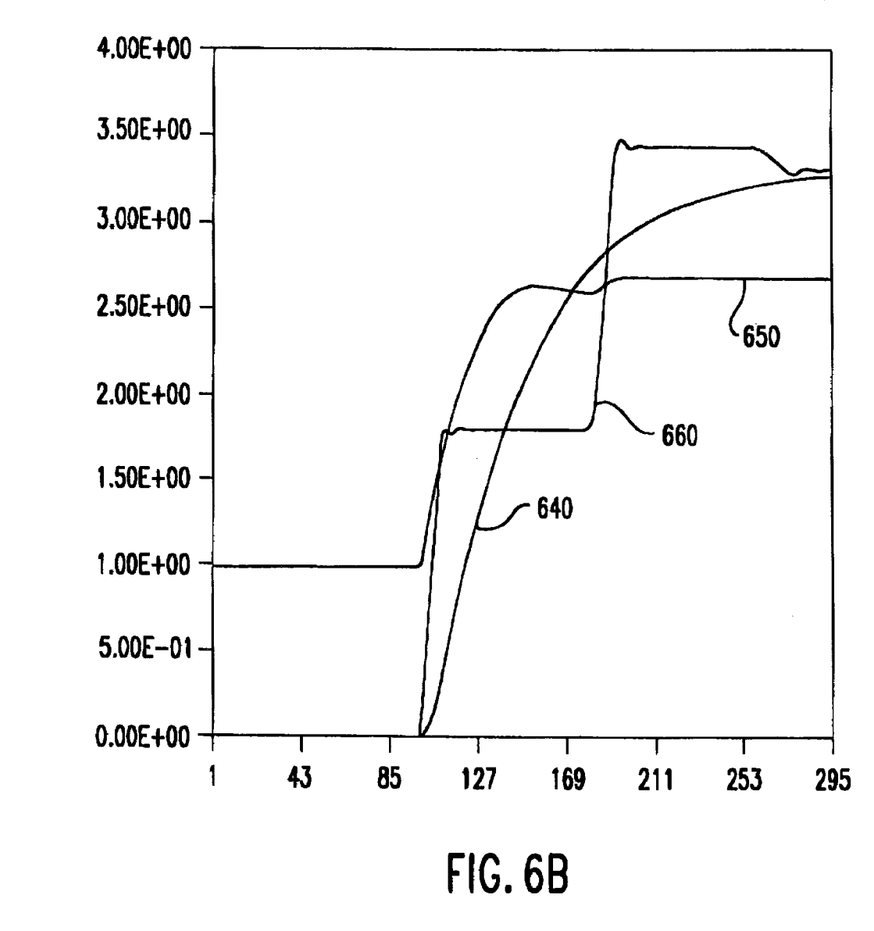

FIGS. 6A and 6B are traces the represent voltage potentials at select points within the circuit of the pulse generator and transient detector shown in FIG. 2 during the generation of a pulse by the pulse generator 210.

The traces in FIG. 6A include a first trace 610 that represents the voltage potential of the gate of the transistor Q1, second trace 620 that represents the voltage potential of the peak detection capacitor C1, and a third trace 630 that represents the voltage potential of the input/output 120, during the duration of a pulse when the connector 130 is properly connected to the conductive trace 140.

The traces in FIG. 6B include a fourth trace 640 that represents the voltage potential of the gate of the transistor Q1, fifth trace 650 that represents the voltage potential of the peak detection capacitor C1, and a sixth trace 660 that represents the voltage potential of the input/output 120, during the duration of a pulse when the connector 130 is not properly connected to the conductive trace 140.

The primary observation to be made between the traces of FIG. 6A and the traces of FIG. 6B, is that the final voltage potential of the second trace 620 that represents the voltage potential of the peak detection capacitor C1 for a properly connected connector 130 is less than the final voltage potential of the fifth trace 650 that represents the voltage potential of the peak detection capacitor C1 for a improperly connected connector 130. Therefore, the voltage detector 220 is able to detect whether or not the connector 130 is properly connected to the conductive trace 140. The previously mentioned predetermined threshold voltage is selected to fall between the final voltage potentials of the peak detection capacitor C2 as shown in FIG. 6A and FIG. 6B.

As previously mentioned, the invention can and is generally extended to include many connectors connected to many outputs of the integrated circuit 110 through many conductive traces. A transient detector is included within the integrated circuit 110 for each output that is electrically connected to a connector.

Figure 7:
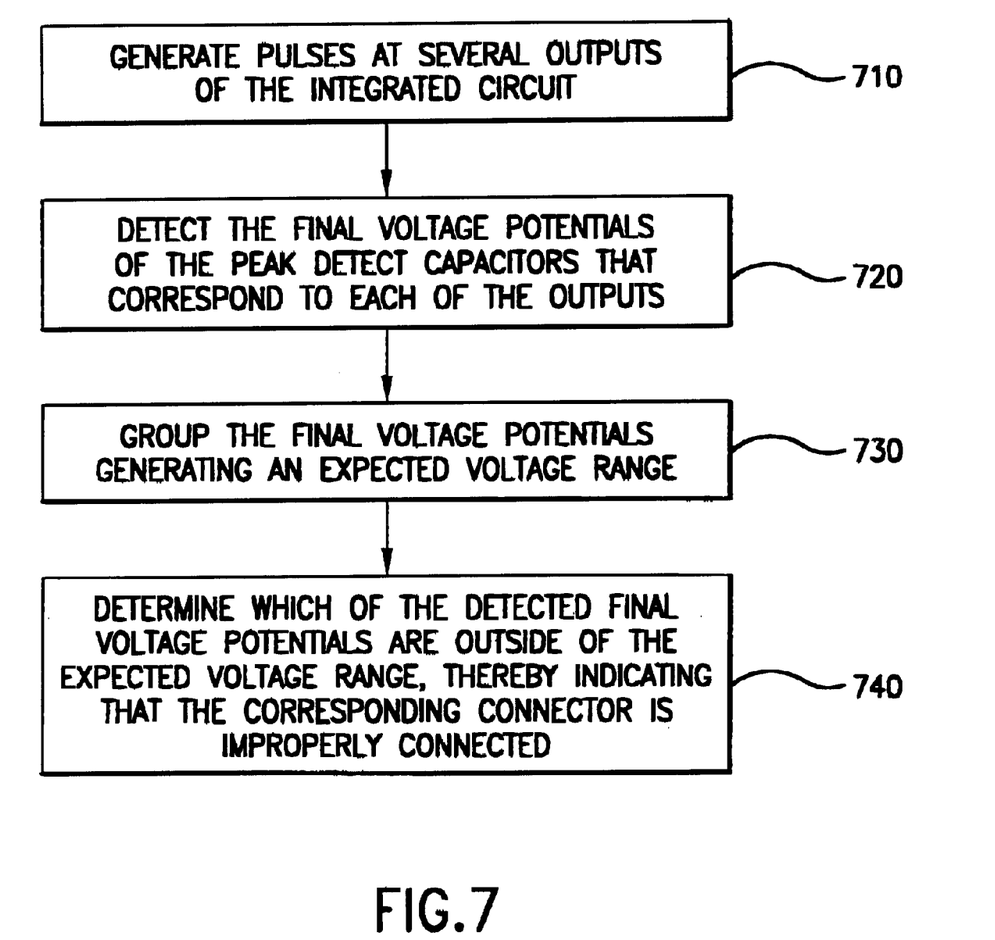
FIG. 7 is a flow chart that shows the steps included in generating an expected voltage range for the final voltage potential of the peak detector capacitors within the transient detectors, and determining which of several outputs of the integrated circuit correspond to an improperly connected connector.

FIG. 7 is a flow chart that shows the steps included in generating an expected voltage range for the final voltage potential of the peak detector capacitors within the transient detectors, and determining which of several outputs of the integrated circuit correspond to an improperly connected connector. The final voltage potential of a peak detector capacitor that corresponds to an improperly connected connector is not within the expected voltage range.

A first step 710 includes generating pulses at several outputs of the integrated circuit 110. Each of the pulses cause the generation of negative reflections if the outputs are properly connected to the connectors that correspond to each of the outputs. The negative reflections as previously described, will cause the final voltage potentials of the corresponding peak detector capacitors of the corresponding pulse transient detectors to be lower than the final voltage potentials of peak detector capacitors of transient detectors that correspond with improperly connected connectors.

A second step 720 includes detecting the final voltage potentials of each of the peak detector capacitors that correspond to each of the outputs. As previously described, an analog to digital converter is typically used to sample the final voltage potentials of the peak detector capacitors. Once digitized, a controller within the integrate circuit 110 can receive the digital samples, or a controller connected to the integrated circuit can receive the digital samples. Once the digital samples of the final voltage potentials have been received by an internal or external controller, comparison between the samples of the final voltage potentials can be made.

A third step 730 includes grouping the final voltage potentials to generate an expected voltage range. Final voltage potentials that fall within the expected voltage range correspond to properly connected connectors. The final voltage potentials of peak detector capacitors that correspond to properly connected connectors will all be approximately the same. However, as previously described, the final voltage potentials of peak detector capacitors that correspond to improperly connected connectors will be greater than the final voltage potentials of peak detector capacitors that correspond to properly connected connectors.

Typically, most of the connectors will be properly connected. Therefore, most of the final voltage potentials will be approximately the same. As a result, the detected final voltage potentials can be grouped, thereby suggesting the final voltage potential of peak detector capacitors that corresponds to properly connected connectors. For example, the final voltage potentials of the peak detector capacitors of the outputs of a first integrated circuit may look like:

| Output # | Final voltage potential |
| --- | --- |
| 1 | 2 Volts |
| 2 | 2 Volts |
| 3 | 2 Volts |
| 4 | 1.8 Volts. |

Whereas the final voltage potentials of the peak detector capacitors of the outputs of a second integrated circuit may look like:

| Output # | Final voltage potential |
| --- | --- |
| 1 | 2.5 Volts |
| 2 | 2.5 Volts |
| 3 | 2.5 Volts |
| 4 | 2.2 Volts. |

For both the final integrated circuit and the second integrated circuit, the final voltage potentials of the outputs 1, 2 and 3 can be grouped to indicate the final voltage potentials of the peak detector capacitor of a properly connected connector. The groupings can used to estimate an expected range final voltage potentials. That is, because the final voltage potentials of many peak detector capacitors will typically be about the same, a grouping of measured final voltage potential can be used to define an expected range of final voltage potential values. For example, an expected range for the first integrated circuit could be selected as 1.95 to 2.05 volts by grouping the final voltage potentials of outputs 1, 2 and 3. An expected range for the second integrated circuit could be selected as 2.45 volts to 2.55 volts. The size of the range can be experimentally determined to optimize the number of improperly connected connectors that are detected.

A fourth step 740 includes determining which of the detected final voltage potentials are outside of the expected voltage range, thereby indicating that the corresponding connector is improperly connected. The fourth outputs of the first integrated circuit and the second integrated circuit both fall outside of the expected range of final voltage potentials. Therefore, the controller would conclude that the fourth outputs correspond to connectors that are improperly connected to the conductive traces.

As previously mentioned, a controller (such as a microprocessor) within the integrated circuit 110 can be programmed to generate or cause the pulse generator 210 to generate the requisite pulse. As is known in the art of computer processors, controllers can interface and communicate with other controllers or computers through computer networks. Therefore, it follows that an external computer can communicate with the controller within the integrated circuit 110 to cause the pulse generator 210 to generate the requisite pulse for testing whether the connector 130 is properly connected to the conductive trace 140.

Although specific embodiments of the invention have been described and illustrated, the invention is not to be limited to the specific forms or arrangements of parts so described and illustrated. The invention is limited only by the claims.

What is claimed:

1. An integrated circuit self-testing system comprising:

a circuit board;

an integrated circuit connected to the circuit board, the integrated circuit having an output;

a connector attached to the circuit board;

a conductive trace of the circuit board electrically connecting the output of the integrated circuit to the connector, the conductive trace comprising a first section extending between the output of the integrated circuit and the connector of the circuit board, and a second section extending beyond the connector;

the integrated circuit comprising:
a pulse generator, the pulse generator generating a pulsed voltage potential at the output; and a pulse transient detector that detects transients in the voltage potential of the output due to a reflected pulse voltage potential received at the output, thereby indicating that the connector is not properly connected to the conductive trace.

2. The integrated circuit self-testing system of claim 1, wherein the pulse generator comprises:

a digital logic gate that drives the output of the integrated circuit from a low voltage potential to a high voltage potential.

3. The integrated circuit self-testing system of claim 2, wherein a controller within the integrated circuit determines when the digital logic gate drives the output of the integrated circuit from a low voltage potential to a high voltage potential.

4. The integrated circuit self-testing system of claim 1, wherein the pulse transient detector comprises a peak detector capacitor in which a final voltage potential of the peak detector capacitor is dependent upon the output of the integrated circuit receiving a negative transient pulse.

5. The integrated circuit self-testing system of claim 1, further comprising:

a plurality of connectors connected to the circuit board;

a plurality of outputs of the integrated circuit, each output connected to a corresponding connector through a corresponding one of a plurality of conductive traces;

a plurality of transient detectors, each transient detector comprising a peak detector capacitor in which a final voltage potential of the peak detector capacitor is dependent upon a corresponding output of the integrated circuit receiving a negative transient; and means for comparing the final voltage potentials of the peak detector capacitors of each of the transient detectors.

6. The integrated circuit self-testing system of claim 5, further comprising:

means for calculating an expected voltage range based upon the final voltage potentials; and means for determining which connectors correspond to the peak detector capacitors that have final voltage potentials that are within the expected voltage range, thereby indicating which of the connectors are properly connected.

7. The integrated circuit self-testing system of claim 4, wherein the pulse transient detector comprises a peak detector diode that conducts charge from the peak detector capacitor when the output of the integrated circuit receives a negative transient pulse.

8. The integrated circuit self-testing system of claim 4, wherein the pulse transient detector further comprises an analog to digital converter connected to the peak detector capacitor, the analog to digital converter detecting the voltage potential of the peak detector capacitor.

9. An integrated circuit self-testing system comprising:

a circuit board;

an integrated circuit connected to the circuit board, the integrated circuit having an output;

a connector attached to the circuit board;

a conductive trace of the circuit board electrically connecting the output of the integrated circuit to the connector, the conductive trace comprising a first section extending between the output of the integrated circuit and the connector of the circuit board, and a second section extending beyond the connector;

the integrated circuit comprising:

means for generating a pulsed voltage potential at the output; and means for detecting transients in the voltage potential of the output due to a reflected pulse voltage potential received at the output, thereby indicating that the connector is not properly connected to the conductive trace.

10. A method of self-testing connectors that are connected to a circuit board, the connectors electrically connected to corresponding outputs of an integrated circuit that is attached to the circuit board through corresponding conductive traces, the conductive traces comprising first sections extending between the outputs of the integrated circuit and the connectors of the circuit board, and second sections extending beyond the connectors, comprising:

generating a pulsed voltage signals at the outputs of the integrated circuit;

detecting transients in the voltage potential of the outputs due to reflected pulse voltage potentials received at the outputs, thereby indicating whether the connectors are properly connected to the conductive traces.

11. The method of self-testing connectors that are connected to a circuit board of claim 10, wherein detecting transients comprises discharging peak detector capacitors through peak detector diodes.

12. The method of self-testing connectors that are connected to a circuit board of claim 11, wherein detecting transients further comprises detecting final voltage potentials of the peak detector capacitors.

13. The method of self-testing connectors that are connected to a circuit board of claim 12, further comprising:

generating an expected voltage range based on the final voltage potentials of the peak detector capacitors; and indicating which outputs correspond to the peak detector capacitors that have final voltage potential outside of the expected voltage range.

14. The method of self-testing connectors that are connected to a circuit board of claim 12, further comprising:

generating an expected voltage range based on the final voltage potentials of the peak detector capacitors; and indicating which outputs correspond to the peak detector capacitors that have final voltage potential within the expected voltage range.

* * * * *